(12) United States Patent
Hata (10) Patent No.: US 6,733,686 B2
(45) Date of Patent: May 11, 2004

(54) METHOD AND DEVICE FOR REMOVING AN UNNECESSARY FILM

(75) Inventor: Mitsuaki Hata, Kitakoma-gun (JP)

(73) Assignee: Hoya Corporation, Tokyo (JP)

( * ) Notice: Subject to any disclaimer, the term of this patent is extended or adjusted under 35 U.S.C. 154(b) by 32 days.

(21) Appl. No.: 09/935,569

(22) Filed: Aug. 24, 2001

(65) Prior Publication Data

US 2002/0000424 A1 Jan. 3, 2002

(51) Int. Cl.$^7$ ................................................ B44C 1/22
(52) U.S. Cl. ............................ 216/91; 134/33; 118/52
(58) Field of Search .......................... 216/91; 134/33; 118/52, 56

(56) References Cited

U.S. PATENT DOCUMENTS

| | | | | |
|---|---|---|---|---|
| 5,474,807 A | * | 12/1995 | Koshiishi | 427/240 |
| 5,489,341 A | * | 2/1996 | Bergman et al. | 134/33 |
| 5,952,050 A | * | 9/1999 | Doan | 118/52 |
| 5,958,630 A | * | 9/1999 | Hashimoto et al. | 430/5 |
| 5,993,547 A | * | 11/1999 | Sato | 118/52 |
| 6,398,975 B1 | * | 6/2002 | Mertens et al. | 216/92 |

FOREIGN PATENT DOCUMENTS

| | | | | |
|---|---|---|---|---|
| JP | 58-193350 | 4/1983 | | G05D/3/12 |
| JP | 6-262124 | 9/1994 | | B05C/11/08 |
| JP | 7-20623 | 1/1995 | | G03F/1/08 |

* cited by examiner

Primary Examiner—Kin-Chan Chen
(74) Attorney, Agent, or Firm—Sughrue Mion, PLLC (57) ABSTRACT

A substrate with a coating film formed thereon is covered with a cover member on the side of its principal surface. A solvent is supplied from the top of the cover member through a plurality of supply holes formed at predetermined positions of the cover member so that an unnecessary film portion of the coating film in a processed region is dissolved by the solvent and removed. In an unprocessed region except the processed region, a gap between an inner surface of the cover member and the surface of the substrate has a size such that temperature distribution is not caused in the coating film formed on the surface of the substrate under the influence of heat transfer from the cover member.

18 Claims, 3 Drawing Sheets

METHOD AND DEVICE FOR REMOVING AN UNNECESSARY FILM

BACKGROUND OF THE INVENTION

This invention broadly relates to a method and a device for removing an unnecessary film formed on a part of a surface of a substrate, such as a photo mask blank including a phase shift mask blank, a semiconductor substrate, a magnetic disk substrate, and a color filter, as well as to a method of manufacturing a photo mask blank.

In the field of manufacturing semiconductor devices, photo masks including phase shift masks, magnetic disk substrates, and color filters, it is often required to remove an unnecessary portion of a coating film or various other films formed on a surface of a substrate, which may shortly be referred to as a substrate surface.

For example, a resist or a SOG (spin on glass) film is formed on the substrate by the use of a spin coating method. In the spin coating method, the substrate is held in a substantially horizontal position and rotated while a coating fluid is dropped on the substrate to thereby form a uniform coating film on the substrate utilizing the centrifugal force.

In this case, if the substrate is rotated at a low speed such that the coating film is uniformly formed throughout the entire surface, the centrifugal force acting upon a peripheral region of the substrate surface becomes small. As a consequence, the coating fluid stays or remains in the peripheral region of the substrate surface so that the coating film is increased in thickness in the peripheral region. In other words, the coating film has a thickened or protruding portion in the peripheral region of the substrate surface.

When the coating film is thickened or protruded in the peripheral region of the substrate surface as mentioned above, various disadvantages will arise. For example, if the coating fluid is SOG, i.e., the coating film is the SOG film, cracks tend to be formed in the peripheral region. Further, in case where a phase shift mask with the SOG film formed on the substrate surface is attached to an exposure device, the substrate is often supported or fixed in the peripheral region. However, in case where the SOG film is protruded in the peripheral region of the substrate as mentioned above, good and reliable support can not be achieved.

Consideration will be made of the case where the coating fluid is a resist, i.e., the coating film is the resist film. For example, in order to perform contact exposure, a photo mask is superposed on the substrate with the resist film applied thereto. In this event, if the resist film is protruded in the peripheral region of the substrate as mentioned above, good and reliable contact between the photo mask and the resist film can not be achieved.

Meanwhile, a storage case is often used when the photo mask blank (including the phase shift mask blank) with the resist film is shipped. Further, a storage cassette may be used when the photo mask blank is produced.

Under such circumstances, the resist film protruding in the peripheral region or on the end face of the substrate surface may be detached in the cause of the storage case, the storage cassette, or the handling process of the photo mask blank, resulting in occurrence of dust. Thus, various disadvantages are caused during the production process of the photo mask.

Under the circumstances, it is necessary to remove, as an unnecessary portion of the coating film, the protruding portion formed in the peripheral region of the substrate surface. Such an unnecessary portion of the coating film may be referred to as an unnecessary film.

In order to remove the unnecessary film, various methods are proposed, for example, in Japanese Examined Patent Publication (B) No. S58-19350, Japanese Unexamined Patent Publication (A) No. H6-262124, and Japanese Unexamined Patent Publication (A) H7-20623.

In the method disclosed in Japanese Examined Patent Publication (B) No. S58-19350, a substrate is placed on a turntable with its principal surface facing upward and rotated while a solvent is sprayed from a nozzle arranged below. Alternatively, a cover having a hollow pyramidal shape is placed on the substrate surface and the solvent is supplied from the top of the pyramid to the peripheral region.

In the method disclosed in Japanese Unexamined Patent Publication (A) No. H6-262124, a predetermined gap is kept between a gap forming member and the substrate surface in a processing area where a processing liquid is to be supplied. Thus, the processing fluid is reliably introduced into the processing area.

In the method disclosed in Japanese Unexamined Patent Publication (A) No. H7-20623, gas is supplied through a gas introduction port formed in a cover member so as to prevent the solvent from leaking into the center of the substrate.

In case where the coating film formed on the substrate surface is the resist film, exposure sensitivity may be delicately influenced by thermal hysteresis applied to the resist, depending upon the material of the resist film. In such a resist film, exposure sensitivity will be nonuniform if the thermal hysteresis is different depending upon the location in the resist film.

Therefore, in case where the above-mentioned removal of the unnecessary film is carried out in an environment such that temperature distribution occurs in the resist film under the influence of the heat of evaporation of the solvent, exposure sensitivity of the resist film becomes nonuniform. However, none of the existing methods described above have addressed to such problem.

SUMMARY OF THE INVENTION

It is therefore an object of this invention to provide a method and a device for removing an unnecessary film or an unnecessary portion of a coating film formed on a substrate surface, which are capable of reliably removing the unnecessary film without producing temperature distribution in the coating film during a removing process to adversely affect the coating film and to provide a method of manufacturing a photo mask blank, which uses the above-mentioned removing method.

According to a first aspect of this invention, there is provided a method of removing, as an unnecessary film, an unnecessary portion of a coating film formed on a surface of a substrate as a substrate surface by dissolving the unnecessary film with a solvent, the method comprising the steps of:

covering the substrate surface with a cover member; and supplying the solvent from the top of the cover member through a supply hole formed at a predetermined position of the cover member so that the unnecessary film is dissolved by the solvent and removed;

the cover member defining a gap between an inner surface thereof and the substrate surface, the substrate surface having an unprocessed region where the coating film is to be left as a necessary film and a processed region where the coating film is to be removed as the unnecessary film, the gap in the unprocessed region having a size such that temperature distribution is not caused in the coating film formed on the substrate surface under the influence of heat transfer from the cover member.

According to a second aspect of this invention, there is provided a method of removing, as an unnecessary film, an unnecessary portion of a coating film formed on a surface of a substrate as a substrate surface by dissolving the unnecessary film with a solvent, the method comprising the steps of:

covering the substrate surface with a cover member; and supplying the solvent from the top of the cover member through a supply hole formed at a predetermined position of the cover member so that the unnecessary film is dissolved by the solvent and removed;

the cover member defining a gap between an inner surface thereof and the substrate surface, the substrate surface having an unprocessed region where the coating film is to be left as a necessary film and a processed region where the coating film is to be removed as the unnecessary film, the gap in the unprocessed region having a size such that temperature distribution is not caused in the coating film formed on the substrate surface under the influence of heat transfer from the cover member and that temperature distribution is not caused in the coating film formed on a principal surface of the substrate due to convection of gas produced in the gap.

According to a third aspect of this invention, there is provided the method in the first or the second aspect, wherein, in the unprocessed region of the substrate surface, the gap has a constant or fixed size.

According to a fourth aspect of this invention, there is provided the method in any one of the first through the third aspects, wherein, in the processed region of the substrate surface, the gap has a size selected so that the solvent supplied to the gap is allowed to pass through the gap and spread in the gap.

According to a fifth aspect of this invention, there is provided the method in any one of the first through the fourth aspects, wherein, in the processed region of the substrate surface, a string-like member having a predetermined thickness is interposed between the inner surface of the cover member and the substrate surface to serve as a gap defining member for defining the size of the gap between the inner surface of the cover member and the substrate surface.

According to a sixth aspect of this invention, there is provided the method in any one of the first through the fifth aspects, wherein the unnecessary film is dissolved and removed by the solvent supplied through the supply hole while the substrate and the cover member are rotated together.

According to a seventh aspect of this invention, there is provided the method in any one of the first through the sixth aspects, wherein the solvent is supplied from the top of the cover member and also supplied from a rear side of the substrate towards the processed region of the Substrate.

According to an eighth aspect of this invention, there is provided a device for removing, as an unnecessary film, an unnecessary portion of a coating film formed on a surface of a substrate as a substrate surface by dissolving the unnecessary film with a solvent, the device comprising:

a cover member covering the substrate surface; and a solvent supply unit for supplying the solvent from the top of the cover member;

the cover member having a supply hole through which the solvent from the solvent supply unit is supplied to the unnecessary film to thereby dissolve and remove the unnecessary film;

the cover member defining a gap between an inner surface thereof and the substrate surface, the substrate surface having an unprocessed region where the coating film is to be left as a necessary film and a processed region where the coating film is to be removed as the unnecessary film, the gap in the unprocessed region having a size such that temperature distribution is not caused in the coating film formed on the substrate surface under the influence of heat transfer from the cover member and that temperature distribution is not caused in the coating film formed on the substrate surface due to convection of gas produced in the gap.

According to a ninth aspect of this invention, there is provided the device in the eighth aspect, wherein, in the unprocessed region of the substrate surface, the gap has a constant or fixed size.

According to a tenth aspect of this invention, there is provided the device in the eighth or the ninth aspect, wherein, in the processed region of the substrate surface, the gap has a size selected so that the solvent supplied to the gap is allowed to pass through the gap and spread in the gap.

According to an eleventh aspect of this invention, there is provided a method of manufacturing a photo mask blank, the method including a film forming process of forming on a light transmitting substrate a film having a light shielding function and/or a phase shift function and a resist film, wherein the film forming process includes an unnecessary film removing process of removing, as an unnecessary film, an unnecessary portion of the resist film by the method described in any one of the first through the seventh aspects.

Herein, it is to be noted that the film having the light shielding function and/or the phase shift function is preferably formed by the use of the known sputtering or vapor deposition while the resist film is desirably formed by the known coating method.

In the first aspect, in the unprocessed region of the substrate (including not only a principal surface but also side surfaces and a rear surface) where the coating film is to be left as the necessary film, the gap between the inner surface of the cover member and the substrate surface has a size selected so that temperature distribution is not caused in the coating film formed on the substrate surface under the influence of heat transfer from the cover member.

With this structure, the unnecessary film can be removed without producing temperature distribution which will be caused by heat transfer from the cover member during a removing process and which may adversely affect the coating film.

Even if the heat of evaporation of the solvent nonuniformly acts on the surface of the cover member to cause temperature distribution in the cover member, it is possible to prevent the coating film on the substrate surface from being influenced by the temperature distribution to become nonuniform in temperature. Therefore, even in case where the coating film is a resist film whose sensitivity may become nonuniform if the thermal hysteresis is different depending upon the location in the resist film, it is possible to effectively prevent the occurrence of such nonuniform sensitivity.

Further, the cover member need not have a special arrangement for preventing the nonuniformity in temperature on its outer surface from reaching the inner surface.

In the second aspect, in the unprocessed region of the substrate where the coating film is to be left as the necessary film, the gap between the inner surface of the cover member and the substrate surface has a size selected so that temperature distribution is not caused in the coating film formed on the substrate surface under the influence of heat transfer from the cover member and that temperature distribution is not caused in the coating film formed on the principal surface of the substrate due to convection of gas produced in the gap.

With this structure, the unnecessary film can be removed, more effectively preventing the occurrence of temperature distribution which will be caused by heat transfer from the cover member during a removing process and which may adversely affect the coating film.

In the third aspect, in the unprocessed region of the substrate surface where the coating film is to be left as the necessary film, the gap between the inner surface of the cover member and the substrate surface has a constant or fixed size.

With this structure, the unnecessary film can be removed, more effectively preventing the occurrence of temperature distribution which will be caused by heat transfer from the cover member during a removing process and which may adversely affect the coating film.

In the fourth aspect, in the processed region of the substrate surface where the coating film is to be removed as the unnecessary film, the gap between the inner surface of the cover member and the substrate surface has a size selected so that the solvent supplied to the gap is allowed to pass through the gap and spread in the gap by the action of surface tension or the like.

With this structure, the solvent supplied from the solvent supply hole can reliably and accurately supplied to the unnecessary film to remove the unnecessary film. For example, the unnecessary film can be removed over a removing width corresponding to the width of a peripheral flat portion of the cover member.

In the fifth aspect, in the processed region of the substrate surface where the coating film is to be removed as the unnecessary film, the string-like member having a predetermined thickness is interposed between the inner surface of the cover member and the substrate surface to serve as a gap defining member for defining the size of the gap between the inner surface of the cover member and the substrate surface. With this structure, the gap having a predetermined size can very easily be formed without providing a special equipment for flowing the solvent throughout the gap in the processed region.

In the sixth aspect, the unnecessary film is dissolved and removed by the solvent supplied through the supply hole while the substrate and the cover member are rotated together. With this structure, the solvent can be uniformly spread and more easily and reliably supplied to the unnecessary film.

In the seventh aspect, the solvent is supplied from the top of the cover member and also supplied from the rear side of the substrate towards the processed region of the substrate where the coating film is to be removed as the unnecessary film. With this structure, the unnecessary film can be more reliably removed. It is noted here that the solvent may be supplied from the rear side prior to, simultaneously with, or subsequent to the supply from the top of the cover member. Alternatively, the solvent may be supplied from the rear side intermittently.

In the eighth aspect, it is possible to obtain a device capable of implementing the methods in the first and second aspects.

In the ninth aspect, in the unprocessed region of the substrate surface where the coating film is to be left as the necessary film, the gap between the inner surface of the cover member and the substrate surface has a constant or fixed size.

With this structure, the unnecessary film can be removed, more effectively preventing the occurrence of temperature distribution which will be caused by heat transfer from the cover member during a removing process and which may adversely affect the coating film.

In the tenth aspect, it is possible to obtain a device capable of more accurately removing the unnecessary film to be removed.

In the eleventh aspect, it is possible to obtain a method of manufacturing a photo mask blank, which is capable of accurately and more easily and reliably removing the unnecessary film.

Herein, "the film having a light shielding function and/or a phase shift function" mentioned above includes a film having a light shielding function, i.e., a light shielding film, a film having both a light shielding function and a phase shift function, i.e., a halftone film, and a film having a phase shift function, i.e., a phase shift film. The photo mask blank includes a conventional photo mask blank with a light shielding film alone formed thereon and a phase shift mask blank with a halftone film or a phase shift film formed thereon.

DESCRIPTION OF THE PREFERRED EMBODIMENTS

Now, description will be made of a preferred embodiment of this invention with reference to the drawing. In the following, a photomask blank with an unnecessary film formed thereon, a device for removing the unnecessary film, and a method of manufacturing the photomask blank will be described.

Figure 1:
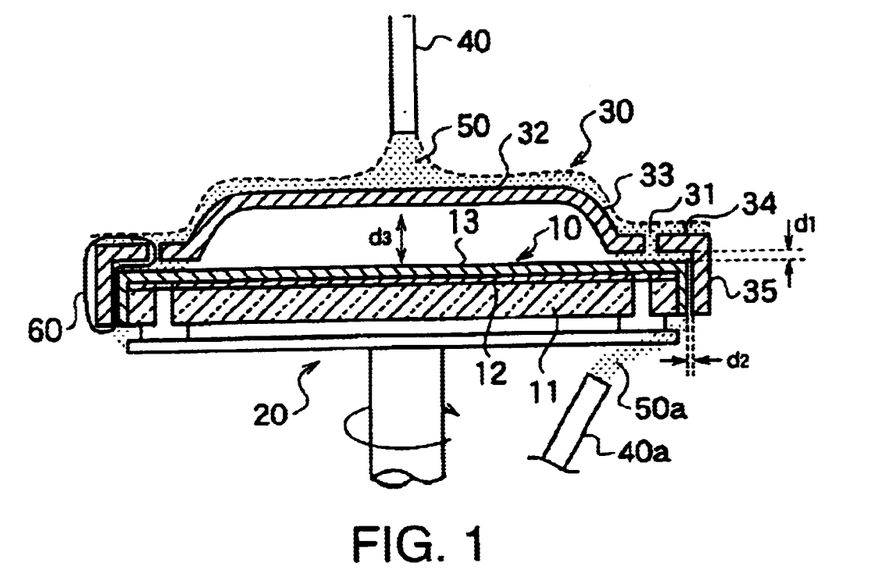
FIG. 1 is a sectional view of a device for removing an unnecessary film according to a first embodiment of the present invention.
Figure 2:
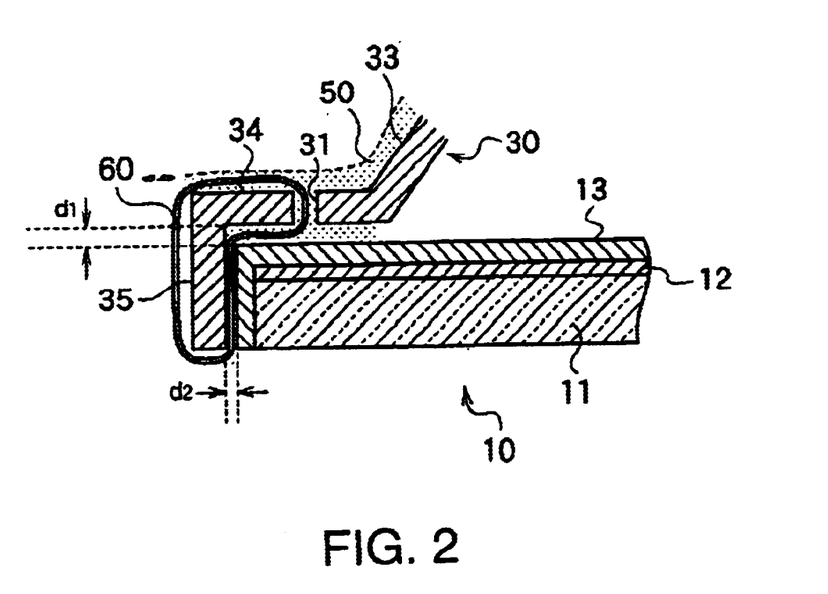
FIG. 2 is an enlarged sectional view of a par: of the device illustrated in FIG. 1.
Figure 3:
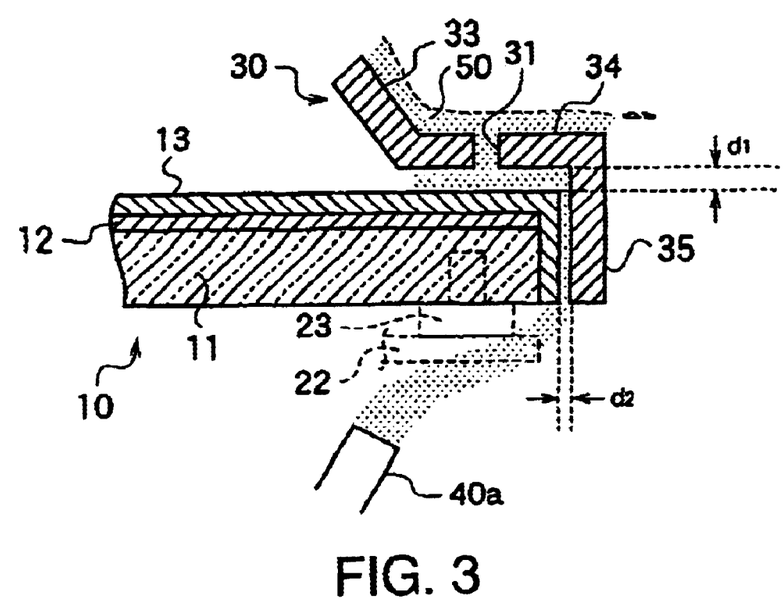
FIG. 3 is an enlarged sectional view of another part of the device illustrated in FIG. 1.
Figure 4:
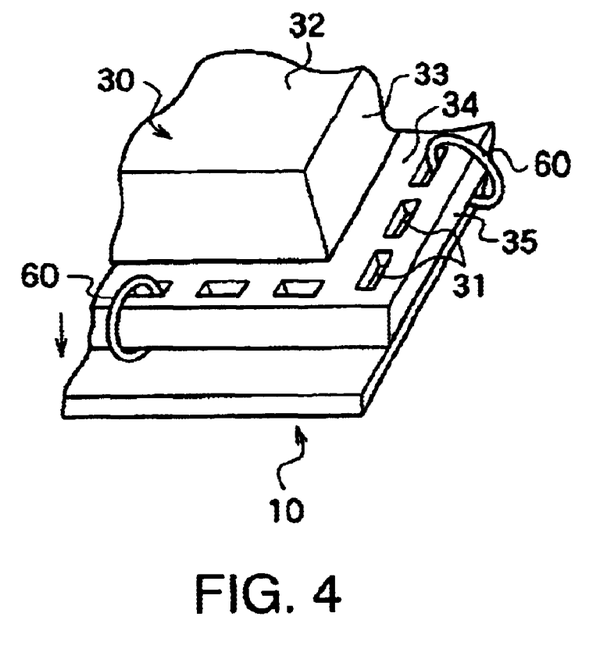
FIG. 4 is a perspective view of a part of the device illustrated in FIG. 1.
Figure 5:
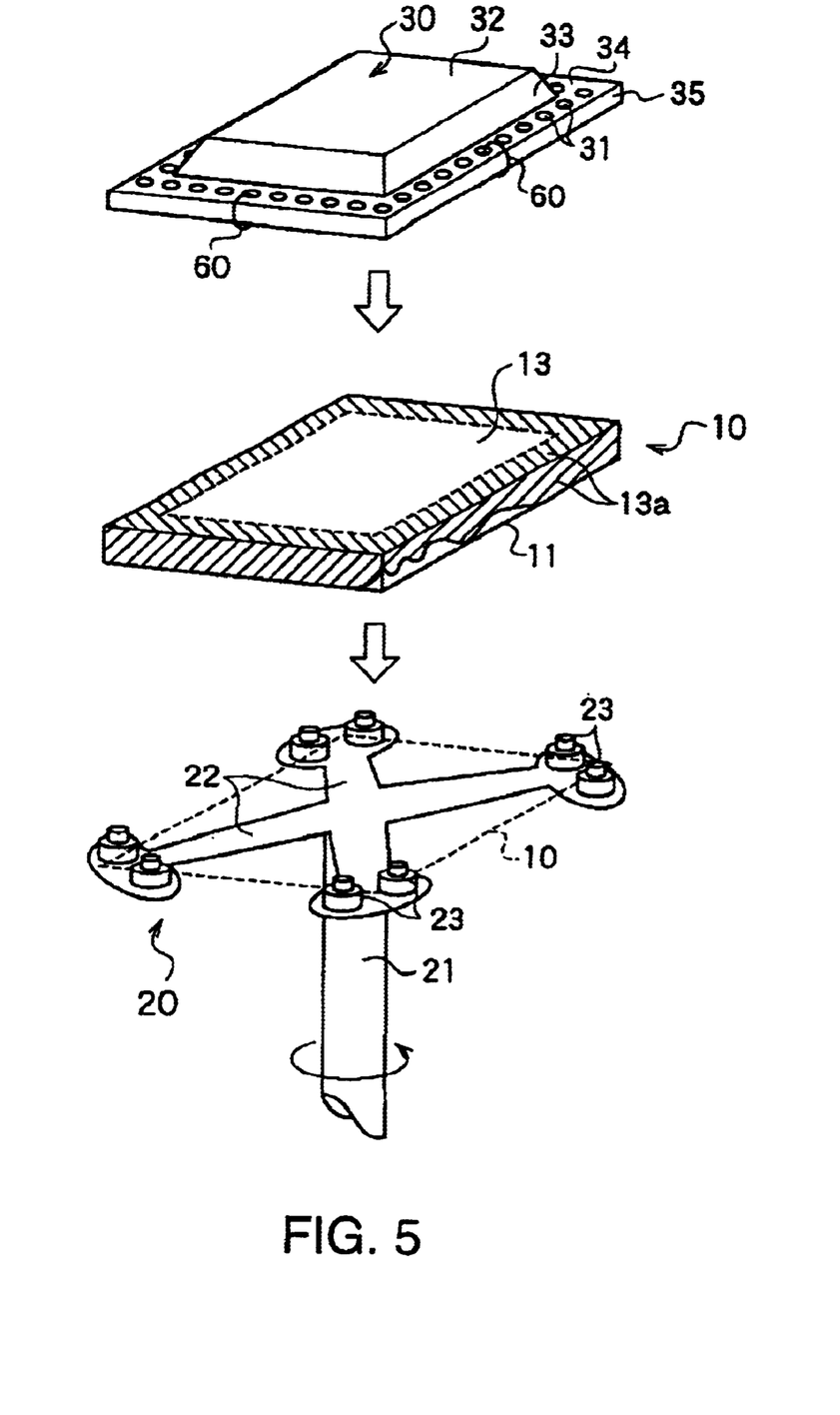
FIG. 5 is an exploded perspective view of the device illustrated in FIG. 1.

Referring to FIGS. 1 through 5, a substrate 10 is a photo mask blank and comprises a transparent substrate (6 inches×6 inches×0.25 inch) 11 made of synthetic quartz glass, a light shielding film 12 made of chromium and formed on the transparent substrate 11, and an resist film (PBSC manufactured by Chisso Corporation) 13, in an unbaked state, having a thickness of 4000 Å and formed on the light shielding film 12 by spin coating or the like (see FIGS. 2 and 3).

Herein, the resist film 13 is essentially formed only on a main part of a principal surface of the substrate 11. However, during formation of the resist film 13 on the main part of the principal surface, the resist film 13 may be unintentionally and unnecessarily formed in a peripheral region of the principal surface, on a side surface, and, sometimes, on a back surface of the substrate 11, although the resist film 13 need not be formed in these areas. Such unnecessary portion of the resist film 13 will be referred to as an unnecessary film or an unnecessary film portion. The method and the device according to this embodiment are for removing the unnecessary film portion.

As shown in FIG. 1, the device of this embodiment comprises a turntable 20 for holding the substrate 10 placed thereon, a cover member 30 covering an upper surface of the substrate 10 placed on the turntable 20, and a nozzle 40 located above the cover member 30 to spray a solvent 50 such as MCA (methyl cellosolve acetate) towards the cover member 30. The solvent 50 sprayed from the nozzle 40 is supplied through a plurality of solvent supply holes 31 formed in the cover member 30 to an unnecessary film portion 13a (see FIG. 5) so that the unnecessary film portion 13a is dissolved and removed.

The cover member 30 covers the substrate 10 on the side of its upper surface or the principal surface. The cover member 30 has a flat portion 32 occupying its major part extending from the center towards an outer periphery, a slant portion 33 surrounding the flat portion 32 and extending therefrom towards the outer periphery, a peripheral flat portion 34 surrounding the slant portion 33 and extending therefrom to the outer periphery, and a side wall portion 35 extending downward from an outer peripheral edge of the peripheral flat portion 34 in a direction substantially perpendicular thereto.

The peripheral flat portion 34 is provided with the solvent supply holes 31 in the form of through holes. The solvent supply holes 31 have a shape, a size, and a pitch appropriately selected in dependence upon the viscosity of the solvent 50 or the like. Specifically, each solvent supply hole 31 may have a square shape, a rectangular shape, a circular shape, an elliptical shape, or any other appropriate shape. The size of each solvent supply hole 31 is selected so that the solvent 50 can be uniformly supplied to the unnecessary film portion 13a at a constant supply speed. The pitch between every two adjacent ones of the solvent supply holes 31 is selected so that the solvent 50 supplied through the solvent supply holes 31 is spread throughout the unnecessary film portion 13a without leaving any gaps.

In this embodiment, each solvent supply hole 31 has a diameter not greater than 10 mm so as to allow the passage of the solvent 50 in an amount sufficient to dissolve the unnecessary film portion 13a around the solvent supply hole 31. The pitch between every two adjacent solvent supply holes 31 (the distance between outer peripheral edges of the holes) is 10 mm or less. If the diameter is too small, the unnecessary film portion 13a around the hole 31 can not be dissolved. On the other hand, if the diameter is greater than 10 mm, the boundary between a removed or processed region corresponding to the unnecessary film portion 13a and an unremoved or unprocessed region except the processed region tends to become irregular. In addition, it becomes difficult to maintain the mechanical strength of the cover member 30. Similarly, if the pitch between every two adjacent one of the solvent supply holes 31 is too small, it is difficult to maintain the mechanical strength of the cover member 30 and, depending upon the diameter, the solvent 50 can not be stably supplied. On the contrary, if the pitch is greater than 10 mm, the boundary between the processed region and the unprocessed region tends; to become irregular and the unnecessary film portion 13a to be removed can not accurately and completely be removed.

A thread 60 (for example, of a resin-based material) resistant against the solvent 50 is made to pass through each of a predetermined number (for example, four) of the solvent supply holes 31 of the substrate 10 and is interposed between the cover member 30 and the substrate 10 to thereby define a gap therebetween. In detail, the thread 60 passes through the solvent supply hole 31, a first gap between the inner surface of the periphery flat portion 34 of the cover member 30 and the surface of the substrate 10, a second gap between the inner surface of the side wall portion 35 and the side surface of the substrate 10, and the outside of the side wall portion 35 to form a loop.

The thread 60 has a thickness selected so that the first gap between the inner surface of the peripheral flat portion 34 and the surface of the substrate 10 has a size $d_1$ allowing the solvent 50 supplied to the first gap to propagate in the first gap and spread throughout the gap. In this embodiment, the size $d_1$ of the first gap falls within a range between 0.05 mm and 3 mm. If the size $d_1$ of the first gap is smaller than 0.05 mm or greater than 3 mm, it is difficult that the solvent 50 propagates in the first gap and spreads throughout the first gap. In this event, an unremovable portion may be left and/or the boundary between the processed region and the unprocessed region becomes irregular.

On the other hand, the second gap between the inner surface of side wall portion 35 and the side surface of substrate 10 has a size $d_2$ such that the solvent 50 can pass through the second gap in contact with the coating film 13, specifically, the unnecessary film portion 13a. The size $d_2$ of the second gap is preferably equal to but may be different from the size $d_1$ of the first gap. In case where $d_2$ is different from $d_1$, additional holes may be formed in the side wall portion 35 to independently define the size of the second gap.

The surface of the substrate (may shortly be referred to as the substrate surface) has a center region facing the inner surface of the flat portion 32 of the cover member 30, which is the major part extending from the center towards the outer periphery. The center region of the substrate surface is the unprocessed region where the coating film is to be left as a necessary film portion. In the above-mentioned center region, a third gap between the inner surface of the cover member 30 and the surface of the substrate 10 has a size $d_3$ selected to be as large as to avoid an influence of heat transfer from the inner surface of the cover member 30 and to be as small as to avoid occurrence of convection of gas within the gap so that temperature distribution is caused in the necessary film portion of the resist film 13 formed in the above-mentioned center region.

In this embodiment, the size $d_3$ of the third gap is within a range between 0.05 mm and 20.0 mm. If $d_3$ is smaller than 0.05 mm, the resist film 13 tends to be subjected to heat transfer from the cover member 30. For example, if the heat of evaporation of the solvent 50 randomly acts on the surface of the cover member 30 to cause wide temperature distribution in the cover member 30, such temperature distribution will be directly reflected as the temperature distribution on the resist film 13 at a high possibility. On the other hand, if $d_3$ is greater than 20.0 mm, it is highly probable that natural convection occurs to cause temperature distribution in the resist film 13. However, this upper limit need not necessarily be determined as mentioned above if the gas within the third gap is forcibly uniformly stirred by any appropriate means to inhibit the occurrence of temperature distribution due to the natural convection.

However, the increase in size of the third gap inevitably results in the increase in height of flat portion 32 of the cover member 30. If the height of the flat portion 32 is too high, the traveling distance required for the solvent 50 supplied from nozzle 40 to reach the peripheral flat portion 34 becomes long. In this event, an increased amount of the solvent 50 may evaporate before reaching the peripheral flat portion 34. Furthermore, in case where the cover member 30 and the substrate 10 are rotated during the removal process, the solvent 50 may often be splashed around. In addition, the device is unfavorably increased in size.

The substrate 10 covered by the cover member 30 is processed while it is held on the turntable 20 and rotated. The turntable 20 comprises a rotation shaft 21 and four support arms 22 attached to the rotation shaft 21 and radially extending in a horizontal direction. Each of the support arms 22 is provided with a pair of holder seats 23 formed at its proximal end thereof. The substrate 10 is held on the turntable 20 with its four corners supported on the holder seats 23. The rotation shaft 21 is coupled to a rotation driving unit (not shown) to be rotated at a desired rotation speed. Below the substrate 10 also, an auxiliary solvent supply nozzle 40a is arranged to supply a solvent 50a. Thus, the unnecessary film portion 13a can reliably be removed.

Now, the operation of the above-mentioned device will be described.

In order to remove the unnecessary film portion 13a, the substrate 10 is at first placed on the turntable 20 and is covered by the cover member 30. Then, the solvent 50 is supplied from the nozzle 40 with its supply amount controlled. Simultaneously, the turntable 20 is rotated for 1 to 60 seconds at a rotation speed of 100 to 1000 rpm. In this manner, the solvent 50 is supplied through the solvent supply holes 31 and infiltrates into the unnecessary film portion 13a to dissolve and remove the unnecessary film portion 13a. At the time when the aforementioned removal process approaches the end, the solvent 50a is sprayed from the nozzle 40a to more reliably dissolve and remove the unnecessary film portion 13a. Thus, the unnecessary film portion 13a is removed. Thereafter, a baking process or the like is carried out to obtain a photo mask blank with a resist film 13 formed at the center of the substrate 10 in a generally square shape.

The state of the resist film 13 of the photo mask blank experimentally obtained as mentioned above was visually observed. As a result, color unevenness of a ring shape due to the temperature distribution caused in the resist film during the removal process was not observed. Further, the boundary between the unprocessed region and the processed region of the resist film formed a substantially straight line. The processed region had a substantially uniform width and the unnecessary film portion was accurately removed. As a result of observing the resist film by the use of a microscope, no pin holes due to splash of the solvent were seen at all.

In the foregoing embodiment, MCA (methyl cellosolve acetate) is used as the solvent for dissolving the resist film. However, the solvent may be any other substance, such as a resist diluent, which can dissolve and remove the unnecessary film portion. In the foregoing embodiment, the thread made of a resin-based material is used as the gap defining member. However, the thread may be made of any other appropriate material which is flexible and resistant against the solvent. Moreover, the gap defining member is not limited to the thread but may have any other appropriate structure as far as the gap can be defined. For example, the gap defining member may be a protrusion formed on the inner surface of the cover member.

The cover member is made of a material which hardly transfers heat, which is resistant against the solvent, and which has a predetermined mechanical strength. For example, use may be made of a resin material, a glass material, a ceramics material, and a composite material comprising a combination thereof. Among others, the resin material is preferable because heat transfer is relatively difficult, shaping is easy, and reduction in weight is easy. Preferably, at least a part of the cover member which covers the necessary film portion of the substrate surface, i.e., the flat portion of the cover member is made of the above-mentioned material.

In the foregoing embodiment, description is made of the case where the resist film is formed on the light shielding film. However, this invention is also applicable to the case where an SOG film is formed on a transparent substrate and a light shielding film is formed on the SOG film. In this case, a film, such as a transparent conductive film or an etching stopper film, other than a light shielding film may be provided. Moreover, this invention is also applicable to a phase shift mask blank comprising a light transmitting substrate with a halftone film, a light shielding film, and a resist film formed thereon as well as a phase shift mask blank comprising a light transmitting substrate with a phase shift film, a light shielding film, and a resist film formed thereon.

Furthermore, this invention is also applicable to removal of an unnecessary film formed when a magnetic disk medium or a color filter is coated with the protective film, removal of an insulation film formed on an electrode portion of wiring on a display substrate, and so on.

In case where the coating film including the unnecessary film portion is the resist film, the solvent may be a liquid, such as ketone, ester, aromatic hydrocarbon, halogenated hydrocarbon, or ether, in which the resist film is soluble.

In case where the coating film including the unnecessary film portion is the SOG film, it is difficult to dissolve the coating film once it is baked. Therefore, it is preferable to dissolve and remove the unnecessary film portion on the back surface, on the side surfaces, and in the peripheral region of the principal surface of the substrate before the substrate is baked, as described in conjunction with the foregoing embodiment. On the other hand, in case where the coating film is the resist film, solution may be possible even after baking, depending upon the material of the resist film.

Further, each of the solvent supply holes 31 may be formed at a position different from that described in the aforementioned preferred embodiment.

The substrate 10 and the cover member 30 are integrally rotated together in the foregoing embodiment but need not necessarily be rotated. However, rotation is preferable because the solvent can relatively quickly and uniformly be spread throughout the gap.

In the foregoing embodiment, the resin thread is used as the gap defining member. Alternatively, a spacer member of a different type may be used.

In the foregoing embodiment, the cover member 30 has a structure such that the unnecessary film portion in the peripheral region of the coating film formed on the substrate of a square shape is removed to leave the necessary film portion of the coating film of a square shape. However, the shape of each of the substrate and the necessary portion of the coating film is not restricted to the square shape but may be any other shape such as a circular shape, a triangular shape, and a polygonal shape. In this case, the cover member is formed to have a solvent supplied surface and an unsupplied surface which are shaped correspondingly.

As described above, according to this invention, the substrate surface is covered with the cover member. The solvent is supplied from the top of the cover member and passes through the solvent supply holes formed at the predetermined positions of the cover member to thereby dissolve and remove the unnecessary film portion. On the other hand, in the center region where the coating film is to be left as the necessary film, the gap between the inner surface of the cover member and the substrate surface is selected so that the temperature distribution is not caused in the coating film on the substrate surface under the influence of heat transfer from the cover member. In this manner, it is possible to provide the method and the device which are capable of reliably removing the unnecessary film without causing, during the removal process, the temperature distribution in the coating film formed on the substrate surface to adversely affect the coating film. It is also possible to provide the method of manufacturing the photomask blank.

What is claimed is:

1. A method of removing, as an unnecessary film, an unnecessary portion of a resist film formed as a coating film on a substrate surface, comprising:

covering said substrate surface with a cover member having a top;

supplying a solvent from the top of said cover member through a supply hole formed at a predetermined position of said cover member; and dissolving said unnecessary film by said solvent;

the cover member defining a gap between an inner surface thereof and said substrate surface, said substrate surface having an unprocessed region where said coating film is to be left as a necessary film and a processed region where said coating film is to be removed as said unnecessary film, said gap in said unprocessed region having a size such that temperature distribution is not caused in said resist film under influence of heat transfer from said cover member, said cover member being made of a material which hardly transfer heat such that exposure sensitivity of said resist film does not become nonuniform, said cover member covering a substrate upper side at which said resist film is formed, said material of said cover member being at least one selected from the group consisting of a resin material, a glass material, a ceramics material, and a composite material comprising a combination thereof, and said solvent being supplied onto the top of said cover member and then supplied to said unnecessary portion through said supply hole at said predetermined position of said cover member.

2. A method of removing, as an unnecessary film, an unnecessary portion of a resist film formed as a coating film on a substrate surface, comprising:

covering said substrate surface with a cover member having a top;

supplying said solvent from the top of said cover member through a supply hole formed at a predetermined position of said cover member; and dissolving said unnecessary film by said solvent;

the cover member defining a gap between an inner surface thereof and said substrate surface, said substrate surface having an unprocessed region where said coating film is to be left as a necessary film and a processed region where said coating film is to be removed as said unnecessary film, said gap in said unprocessed region having a size such that temperature distribution is not caused in said resist film under influence of heat transfer from said cover member, temperature distribution is not caused in said resist film formed on a principal surface of said substrate due to convection of gas produced in said gap, and said cover member is made of a material which hardly transfer heat such that exposure sensitivity of said resist film does not become nonuniform, said cover member covering a substrate upper side at which said resist film is formed, said material of said cover member being at least one selected from the group consisting of a resin material, a glass material, a ceramics material, and a composite material comprising a combination thereof, and said solvent being supplied onto the top of said cover member and then supplied to said unnecessary portion through said supply hole at said predetermined position of said cover member.

3. A method as claimed in claim 1 or 2, wherein:

said gap has a constant or fixed size in said unprocessed region.

4. A method as claimed in claim 1 or 2, wherein:

said gap has a size selected so that said solvent supplied to said gap is allowed to pass through said gap and spread in said gap in said processed region.

5. A method as claimed in claim 4, wherein:

said cover member covers said substrate from an upper surface, said cover member has a flat portion occupying a major part extending from a center towards an outer periphery, a slant portion is formed such that said solvent flows from said flat portion towards said outer periphery, a peripheral flat portion having solvent supply holes is formed from said slant portion towards said outer periphery, and a side wall portion is extending downward from an outer peripheral edge of said peripheral flat portion in a direction substantially perpendicular thereto.

6. A method as claimed in claim 5 wherein;

said gap between said inner surface of said cover member and said substrate surface falls within a range between 0.05 mm and 3 mm in said processed region where said resist film is to be removed as said unnecessary film, said gap between said inner surface of said cover member and said substrate surface falls within a range between 0.05 mm and 20.0 mm in said unprocessed region where said resist film is to be left as said necessary film, and another gap between an inner surface of a side wall portion of said cover member and a side surface of said substrate has a size such that said so solvent passes through said gap in contact with said resist film.

7. A method as claimed in claim 1 or 2, wherein:

a string-like member having a predetermined thickness is interposed between the inner surface of said cover member and said substrate surface to serve as a gap defining member for defining a size of said gap between the inner surface of said cover member and said substrate surface in said processed region.

8. A method as claimed in claim 1 or 2, wherein:

said unnecessary film is dissolved and removed by said solvent supplied through said supply hole while said substrate and said cover member are rotated together.

9. A method as claimed in claim 1 or 2, wherein:

said solvent is supplied from the top of said cover member and also supplied from a rear side of said substrate towards said processed region.

10. A method as claimed in claim 1 or 2, wherein:

said material of said cover member is at least one selected from the group consisting of a resin material, a glass material, a ceramics material, and a composite material comprising a combination thereof.

11. A method as claimed in claim 1 or 2, wherein:

said resist film is a resist film in an unbaked state.

12. A device for removing, as an unnecessary film, an unnecessary portion of a resist film formed as a coating film on a substrate surface by dissolving said unnecessary film with a solvent, comprising:

a cover member covering said substrate surface and having a top; and a solvent supply unit for supplying said solvent from the top of said cover member;

the cover member having a supply hole through which said solvent from said solvent supply unit is supplied to said unnecessary film to thereby dissolve and remove said unnecessary film;

the cover member defining a gap between an inner surface thereof and said substrate surface, said substrate surface having an unprocessed region where said coating film is to be left as a necessary film and a processed region where said coating film is to be removed as said unnecessary film, said gap in said unprocessed region having a size such that temperature distribution is not caused in said resist film under influence of heat transfer from said cover member and that temperature distribution is not caused in said resist film due to convection of gas produced in said gap, and said cover member is made of a material which hardly transfer heat such that exposure sensitivity of the resist film does not become nonuniform.

13. A device as claimed in claim 12, wherein:

said gap has a constant or fixed size in said unprocessed region.

14. A device as claimed in claim 12 or 13, wherein:

said gap has a size selected so that said solvent supplied to said gap is allowed to pass through said gap and spread in said gap in said processed region.

15. A method of manufacturing a photo mask blank, comprising:

depositing a film having a light shielding function and/or a phase shift function and a resist film on a light transmitting substrate, and removing as an unnecessary film, an unnecessary portion of said resist film by the method claimed in any one of claims 1 or 2, the unnecessary film being formed in the deposition step.

16. A method as claimed in claim 15, wherein:

the necessary film is formed on at least a surface peripheral region and a side surface region of the substrate, and the unnecessary film is removed in said unnecessary film removing step.

17. A method as claimed in claim 16, wherein:

the unnecessary film is formed on a back surface of the substrate, and the unnecessary film is removed in said unnecessary film removing step.

18. A method as claimed in claim 15, wherein:

the film having the light shielding function and/or the phase shift function is formed by sputtering or vapor deposition, and the resist film is formed by coating.

* * * * *